United States Patent
Hisada et al.

(10) Patent No.: US 7,791,209 B2
(45) Date of Patent: *Sep. 7, 2010

(54) METHOD OF UNDERFILL AIR VENT FOR FLIPCHIP BGA

(75) Inventors: Takashi Hisada, Ritto (JP); Sayaka Nishi, Yamato (JP)

(73) Assignee: International Business Machines Corporation, Armonk, NY (US)

(*) Notice: Subject to any disclaimer, the term of this patent is extended or adjusted under 35 U.S.C. 154(b) by 130 days.

This patent is subject to a terminal disclaimer.

(21) Appl. No.: 12/046,772

(22) Filed: Mar. 12, 2008

(65) Prior Publication Data

US 2009/0230566 A1    Sep. 17, 2009

(51) Int. Cl.
*H01L 23/48* (2006.01)

(52) U.S. Cl. .................. 257/778; 257/787; 257/738; 29/855; 29/856; 438/106

(58) Field of Classification Search ............. 29/25.42, 29/830–852, 729, 739, 740–743, 855–856; 228/180.21–180.22; 438/106, 108, 125–126; 257/48, 693, 698, 728, E23.179, 778, 787, 257/738; 174/255, 262–264
See application file for complete search history.

(56) References Cited

U.S. PATENT DOCUMENTS

| | | | |
|---|---|---|---|
| 6,048,656 A | | 4/2000 | Akram et al. |
| 6,081,997 A | * | 7/2000 | Chia et al. .................. 29/841 |
| 6,369,449 B2 | * | 4/2002 | Farquhar et al. ............ 257/778 |
| 6,653,172 B2 | | 11/2003 | DiStefano et al. |
| 6,895,666 B2 | | 5/2005 | Hong et al. |
| 6,902,954 B2 | * | 6/2005 | Shi ............................ 438/108 |
| 7,183,139 B2 | * | 2/2007 | Jayaraman et al. ......... 438/118 |
| 7,268,012 B2 | * | 9/2007 | Jiang et al. ................. 438/106 |
| 7,348,597 B1 | * | 3/2008 | Degerstrom et al. ......... 257/48 |

OTHER PUBLICATIONS

Slesinger, Flip Chip Spray Fluxing: Method and Apparatus, IBM Technical Disclosure Bulletin, Mar. 1997, v40 n3 Mar. 1997 p. 53-56.

* cited by examiner

*Primary Examiner*—Minh Trinh
(74) *Attorney, Agent, or Firm*—The Law Firm of Andrea Hence Evans, LLC

(57) ABSTRACT

This invention relates to ejecting an underfill resin at multiple semiconductor die edges such that vacuum suction provided at a laminate through hole located beneath a stage enables spread of underfill resin from each edge simultaneously for quicker spread and reduction of voids. The excess underfill resin intentionally suctioned through the through hole air vent on the underside of the laminate is attracted to re-usable tape. The attracted underfill resin is cleaned from a rotating head mechanism by a cleaning pad positioned beneath a lower surface of the head.

1 Claim, 9 Drawing Sheets

FIG.6

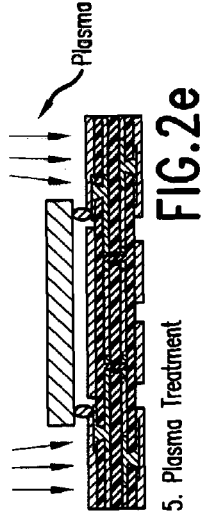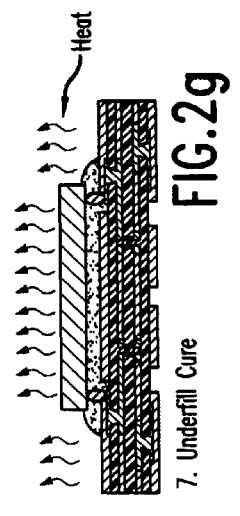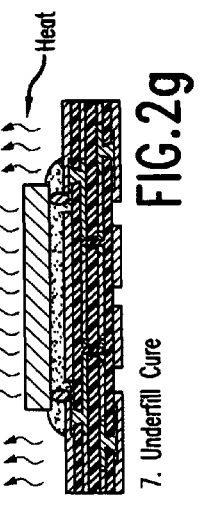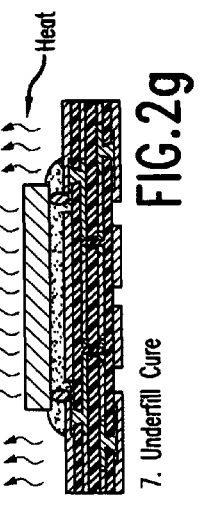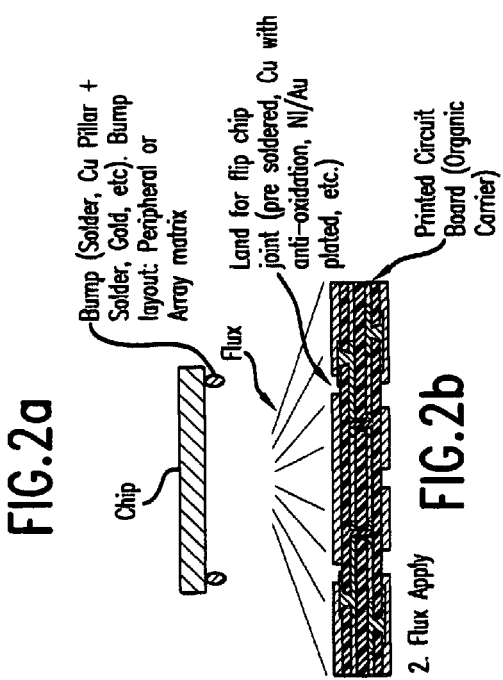

METHOD OF UNDERFILL AIR VENT FOR FLIPCHIP BGA

CROSS REFERENCE TO RELATED APPLICATIONS

There are no cross-references related to this application.

FIELD OF THE INVENTION

The present invention relates to flip-chip ball grid array (BGA) packaging, and more particularly to an underfill material injection system for a semiconductor package that eliminates voids or air bubbles between a semiconductor chip and a BGA substrate during an underfill process and in a manner which shortens the underfill time.

BACKGROUND OF THE INVENTION

FIGS. 1a through 1d illustrate an existing technique for putting underfill resin 602 beneath the surface of a semiconductor die 601. The underfill resin 602 is placed along two adjacent edges of the semiconductor die 601 wherein the adjacent edges intersect. After a period of time has elapsed, the underfill resin 602 begins to spread by capillary effect across the under surface of the die to opposing intersecting edges until the underneath of the die is completely covered. However, the coverage of the voids (i.e. air pockets or bubbles) on the semiconductor surface is not easy to control. Further, there is a long processing time for the underfill resin to level out.

In the past, the underfill resin has been applied along two edges of a multiple edged die deeming it necessary to wait for the resin to completely spread out by capillary effect such that the underfill levels out beneath the die to substantially cover the surface underneath the die and eliminate voids. Further, there is a significant problem created when overfill occurs absent a clean up mechanism to prevent over-spreading of the underfill material.

Akram et at., disclose, in U.S. Pat. No. 6,048,656 A, issued Apr. 11, 2000, a vacuum source placed over an opening to draw underfill material in a uniform manner throughout interstices so that voids are not created. Akram et al. disclose dams disposed along multiple edges of a flip chip in order to help contain the flow of underfill material 190. Akram et al. further disclose using multiple vacuum sources and multiple injection sites to assist in the spread of underfill across the under surface of flip chip 110. Further, Akram discloses the underfill material may be inserted from an aperture in the substrate located beneath the semiconductor device.

However, Akram et al. is not directed towards providing a laminate through hole in physical communication with an air vent and a vacuum source to promoting flow of underfill from each edge of a semiconductor chip simultaneously. Further, Akram et al. is not concerned with intentionally creating excessive underfill at a through hole exit to eliminate voids and cleaning and sealing the through hole in the manner of the present invention.

DiStefano et al. disclose, in U.S. Pat. No. 6,653,172 B2, issued Nov. 25, 2003, methods for providing substantially void-free layers for semiconductor assemblies. DiStefano et al. disclose providing an interposer layer between such a fluid encapsulant between a semiconductor chip and a substrate so that voids within the interposer layer are sealed after applying pressure simultaneously to the voids. However, DiStefano et al. is not directed towards providing a laminate through hole in physical communication with an air vent and a vacuum source to promoting flow of underfill from each edge of a semiconductor chip simultaneously. Further, DiStefano et al. is not concerned with intentionally creating excessive underfill at a through hole exit to eliminate voids and cleaning and sealing the through hole in the manner of the present invention.

In order to combat the issue of voids, Hong et al., discloses in U.S. Pat. No. 6,895,666 B2, issued May 24, 2005, an underfill system for a semiconductor package. The underfill system uses a nozzle to dispense underfill resin into a gap between semiconductor chips and substrates. The gap is filled with the underfill resin due to a pressure difference between a main duct and a plurality of sub-ducts that occurs when a blower blows air through the main duct causing suction of the underfill from the sub-ducts. The invention of Hong et al. provides for shortened filling time of the underfill process and prevents voids (i.e. air bubbles) of the filling material from forming within the gap.

However, Hong et al. is not directed towards providing a laminate through hole in physical communication with an air vent and a vacuum source to promoting flow of underfill from each edge of a semiconductor chip simultaneously. Further, Hong et al. is not concerned with intentionally creating excessive underfill at a through hole exit to eliminate voids and cleaning and sealing the through hole in the manner of the present invention.

Further, none of the prior art inventions resolve the issue of preventing over spreading of the underfill material. However, each of these solutions encounters significant problems. One problem is the residual void occurring in underfill resin is not eliminated in a low cost manner. The difficulty in the void control contributes to a significant increase in manufacturing costs in light of the prior art. Another problem is there is a long process time for resin leveling. Further, the inefficient and time-consuming prior art underfill techniques also cause undue and significant increases in the manufacturing costs. None of the prior an attempts resolve the problem caused by excessive resin underfill.

Despite these and other efforts in the art, still further improvements in enabling quicker underfill spread, reduction of voids and optimal management of excessive resin underfill would be desirable.

SUMMARY OF THE INVENTION

The present invention provides an apparatus and method of using a through hole of a laminate as an air vent to carry out underfilling after a flip-chip joint processing.

The present invention further provides creating the through hole in the laminate by drilling or laser methods. The through hole is normally capped by solder resist, but s designed not to be capped by solder resist in the embodiments of this invention.

Vacuum suction is applied from the bottom side of the laminate via the through hole in order to assist the resin underfilling process. The vacuum suction is equipped at the stage which contacts the back side of the laminate. This enables faster underfilling to occur. Intentionally exposing excessive underfill resin at a rate of approximately at most 10% of the total underfill resin amount at the through hole aids in completely eliminating the occurrence of voids.

A head which has a pressure sensor detects resin from the through hole and moves up to press excessive resin at the hole to flatten and cap with appropriate timing control. The head is covered with a tape belts, and tape area wherein resin is attached and moved down towards the cleaner pad by rotary mechanism. Resin attached on tape is cleaned by the cleaner pad, and the tape can continue to be re-used.

The time required to complete the underfill process will be less than ½ by putting the underfill at least on four edges of a semiconductor die.

An aspect of an embodiment of the invention provides for vacuum suction and flattening excessive resin protrusions at the air vented through hole reducing voids in the underfill process.

A further aspect of an embodiment of the invention is to control excessive resin enabling reduction of droplets of underfill resin at the chip edge.

An aspect of an embodiment of the invention, though excessive underfill resins at the through hole can result in large protrusions which affect manufacturability of the apparatus and method, provides for the possibility of minimizing influences of the protrusions by flattening the underfill protrusions.

Additional aspects, objectives and features of the present invention will become apparent from the following description of the preferred embodiments with reference to the attached drawings.

BRIEF DESCRIPTION OF THE DRAWINGS

FIGS. 2a-2g illustrates an example of a flip-chip joint in accordance with the embodiments of the present invention.

DETAILED DESCRIPTION OF THE INVENTION

FIGS. 2a-2g illustrate an example of a flip-chip joint. FIG. 2a illustrates a wafer bumping by plating, printing, ball bonding, or the like. The bump can be comprised of solder, Cu pillar and solder, gold, or the like. The bump layout can be either peripheral or an array matrix. FIG. 2b illustrates application of a flux to the printed circuit board (PBC) which can be comprised of an organic carrier wherein no pre-solder is required. The land for the flip chip joint can be pre-soldered or the land can be comprised of Cu with anti-oxidation, or can be Ni/Au plated, etc. FIG. 2c illustrates flip chip placement. FIG. 2d illustrates reflow soldering after flip-chip placement. FIG. 2e illustrates a plasma treatment process. FIG. 2f illustrates applying an underfill resin. FIG. 2g illustrates curing the underfill resin. Each of these figures when taken as a whole illustrate the semiconductor packaging process upon which this present invention is based.

Figure 1A:
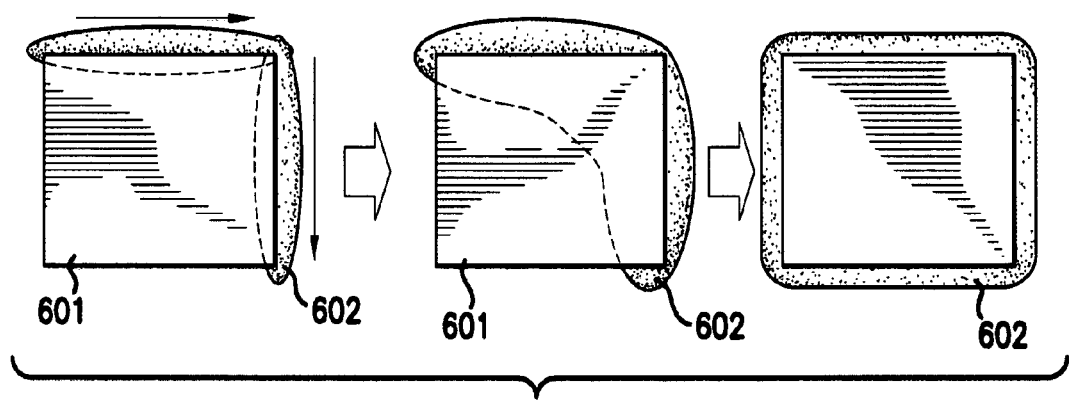
FIG. 1a illustrates a two-edged underfill technique, in accordance with a conventional invention.
Figure 1B:
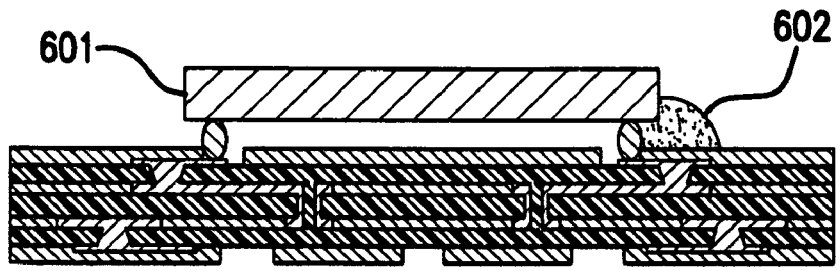
FIGS. 1b-1d illustrate a cross sectional view of a two-edged underfill technique, in accordance with a conventional invention.
Figure 1C:
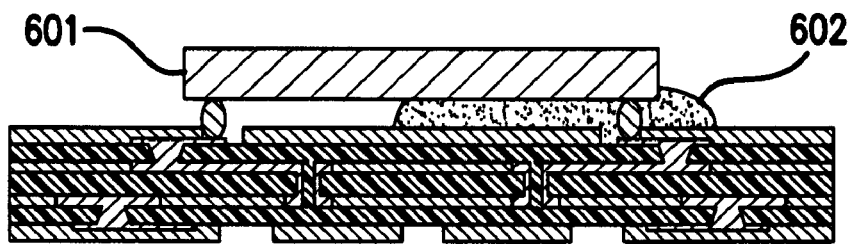
Figure 1D:
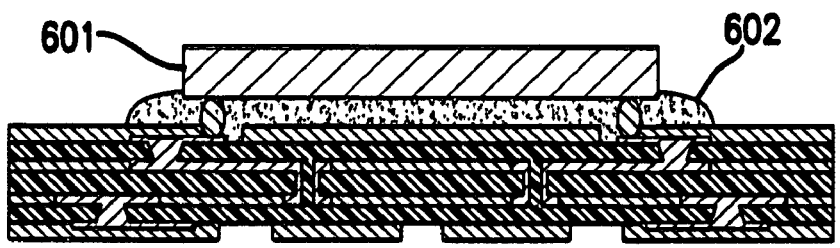
Figure 3A:
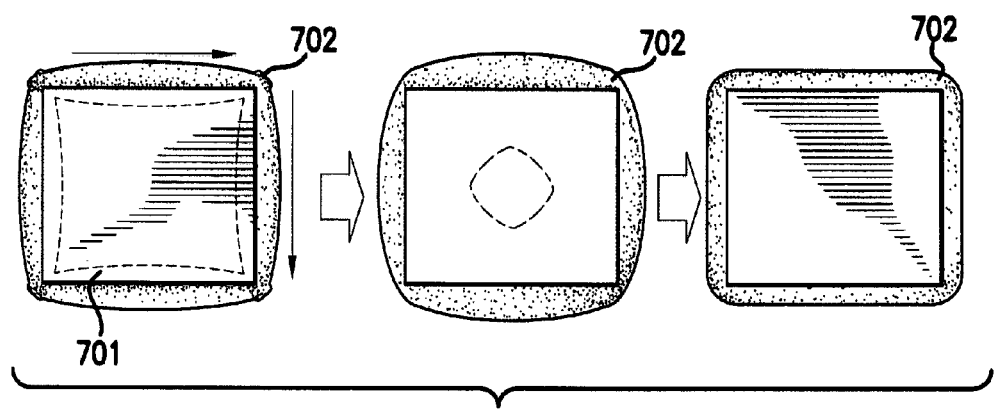
FIG. 3a illustrates a top view of a multiple-edged underfill technique, in accordance with the embodiments of the present invention.

FIG. 3a illustrates a top view of a technique for putting underfill beneath the surface of a semiconductor die 701 in accordance with an embodiment of the present invention. In a first embodiment, underfill material 702 is placed along all peripheral edges of a semiconductor die.

Figure 3B:
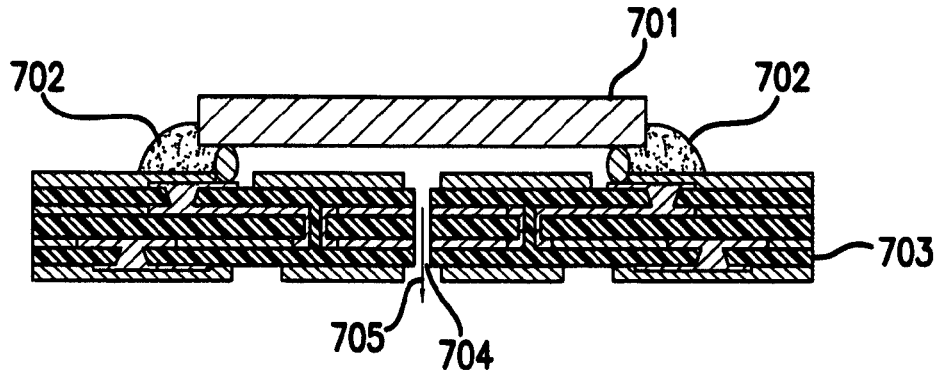
FIG. 3b-3d illustrates a cross sectional view of a multiple-edged underfill technique, in accordance with the embodiments of the present invention.
Figure 3C:
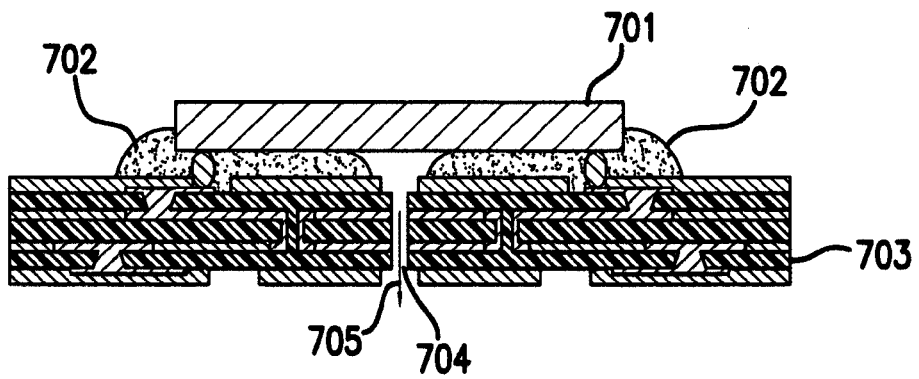
Figure 3D:
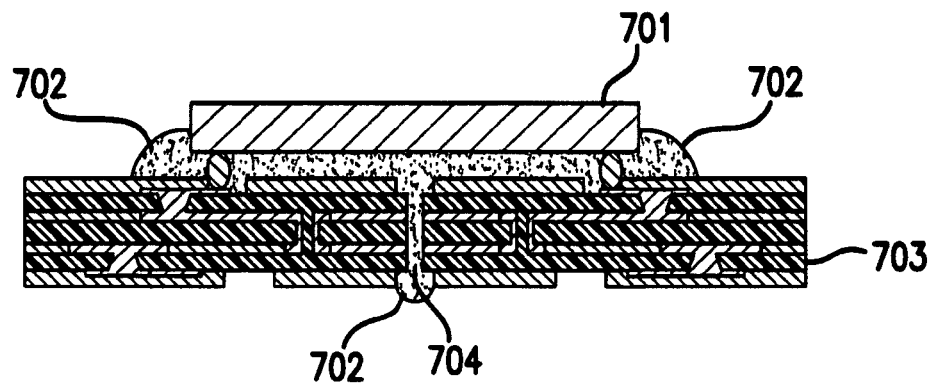

FIG. 3b-3d are cross sectional views illustrating a laminate 703 having a through hole 704 located in the center. The through hole 704 is made by drilling or laser. Further, the through hole 704 is not capped by solder resist. A vacuum source (not shown) provides suction in the direction of arrow 705 from the backside of the laminate. The vacuum source contains a suction port built into a machine stage which will be discussed in detail in a further embodiment. The vacuum source enables quicker underfill and reduces the occurrence of voids (i.e. air bubbles). The through hole 704 can be Cu-plated. In this case, the through hole can be an electrical conduit and thermal conduction path. The through hole further serves as an air vent. The location of the through hole does not necessarily have to be at the flip-chip center. The offset can be optimized considering spreadout of underfill resin. Further, multiple through holes can be applied, as well.

Figure 4:
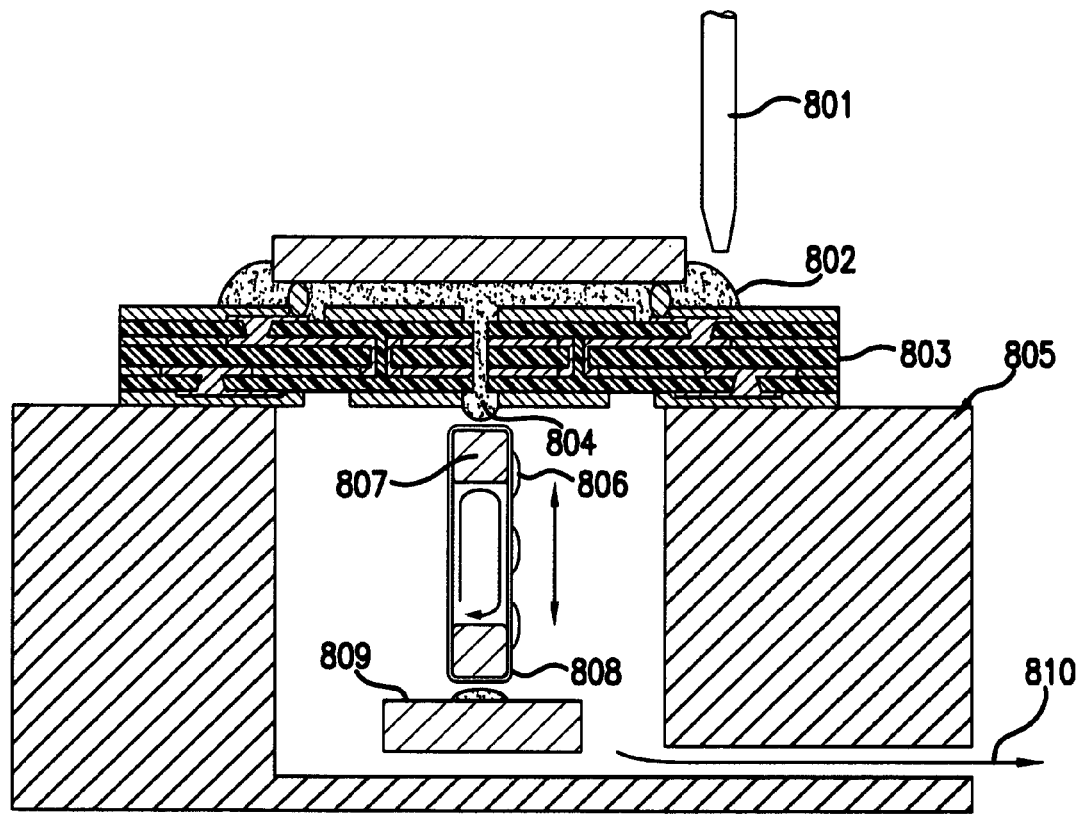
FIG. 4 illustrates an underfill technique with a vacuum and cleaning mechanism, in accordance with the embodiments of the present invention.

FIG. 4 illustrates an underfill apparatus in accordance with another embodiment of the present invention. As shown, a dispense nozzle 801 dispenses underfill resin 802 into in a similar manner as described in the previous embodiment. The semiconductor die 803 consists of a laminate having a through hole 804. The semiconductor die 803 rests on a machine stage 805. A vacuum source (not shown) causes air to move in the direction of arrow 810 and suctions the underfill resin 802 out of the through hole 804. Excessive underfill resin at the through hole 804 on the backside of the semiconductor die 803 can form a large protrusion which manifests itself by spreading out widely around the through hole opening. A head mechanism which is comprised of a pressure sensor 807, tape 808, and cleaning pad 809, moves up and down, and is a part of the machine stage. The tape is rotated and operates in such a manner as to use pressure to continually remove the excessive underfill resin onto a clean surface of tape. The underfill resin 802 can be cleaned at the cleaning pad located at the base of the head mechanism.

Figure 5:
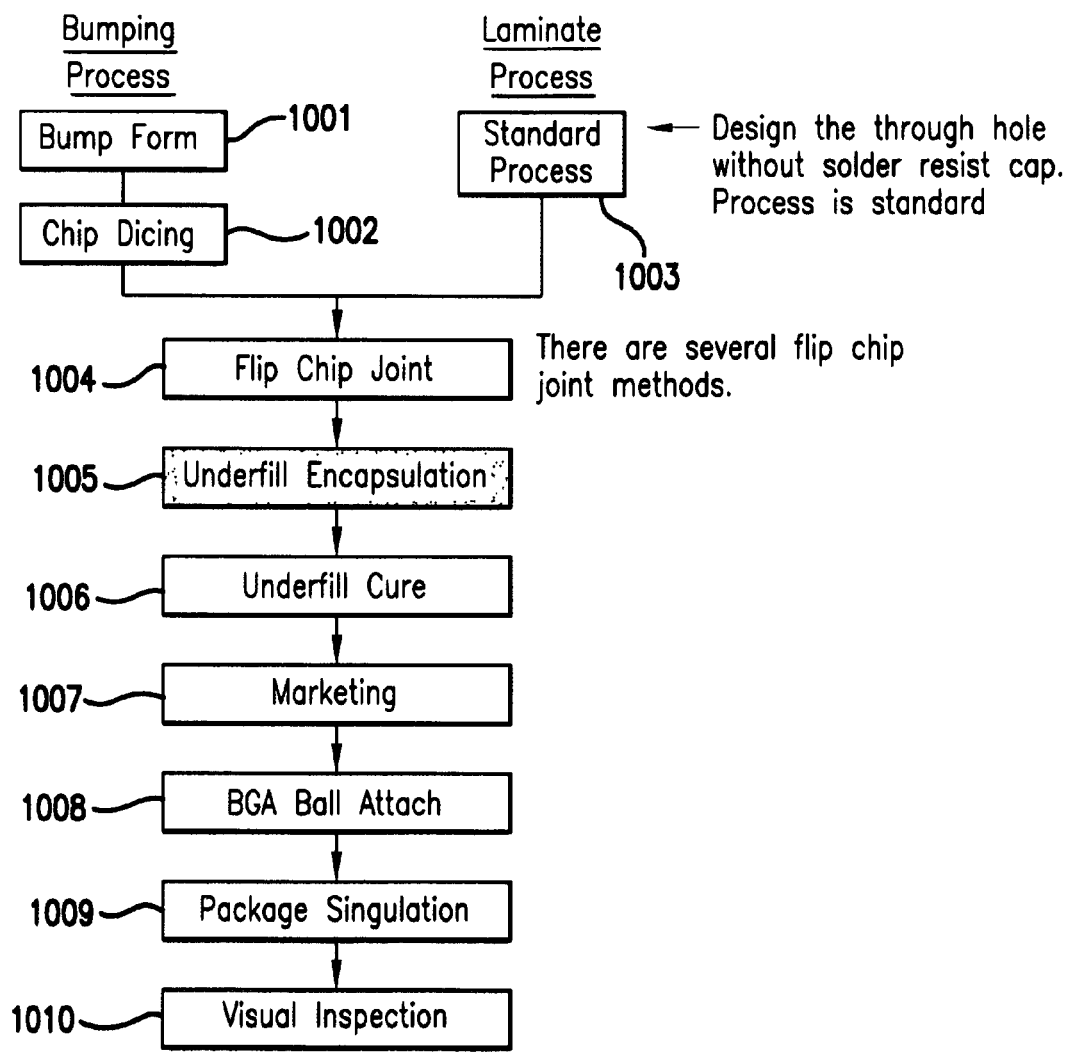
FIG. 5 illustrates a process for underfill encapsulation, in accordance with the embodiments of the present invention.

FIG. 5, illustrates a packaging process in another embodiment of the present invention. Step 1001 involves bumping process to form a bump. There are several conventional types of bump forming processes. Step 1002 is a chip dicing process. The bumping process and the chip dicing process are standard processes which can be reversed. Step 1003 is a standard laminate design process. The laminate design process involves using a drilling or laser process to form a through hole in the laminate. The through hole is formed without a solder resist cap in a standard processing manner. Step 1004 involves forming a flip-chip joint. There are several flip chip joint methods. Step 1005 involves an underfill encapsulation process. Step 1006 involves an underfill cure process. Step 1007 involves a marking step. Step 1008 involves a ball grid array (BGA) ball attach process. Step 1009 involves a package singulation process. And, Step 1010 involves a visual inspection process.

Figure 6:
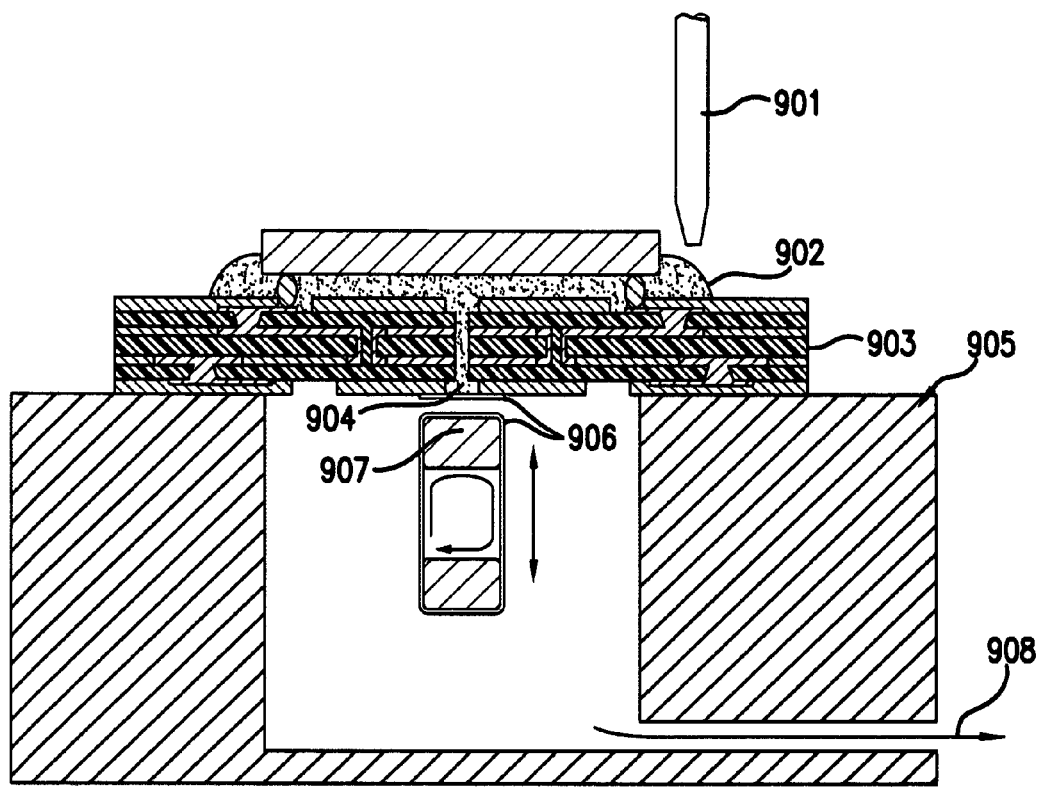
FIG. 6 illustrates an underfill technique with a vacuum and sealing mechanism, in accordance with the embodiments of the present invention.

FIG. 6 illustrates an underfill apparatus in accordance with another embodiment of the present invention. As shown, a dispense nozzle 901 dispenses underfill resin 902 into in a similar manner as described in the previous embodiment. The semiconductor die 903 consists of a laminate having a through hole 904. The semiconductor die 903 rests on a machine stage 905. A vacuum source (not shown) causes air to move in the direction of arrow 908 and suctions the underfill resin 902 out of the through hole 904. Optionally, adhesive tape is applied across the through hole 904 to either permanently or temporarily seal the through hole 904 located at the backside of laminate 903. Excessive underfill resin at the through hole 904 on the backside of the laminate 903 can form a large protrusion which manifests itself by spreading out widely around the through hole opening. A head mechanism which is comprised of a pressure sensor 907, and tape 906, moves up and down, and is a part of the machine stage. Optionally, the tape is rotated and operates in such a manner as to use pressure to attach large pieces of adhesive tape to flatten the protrusion and seal it at the same time in an alternative method.

Figure 7:
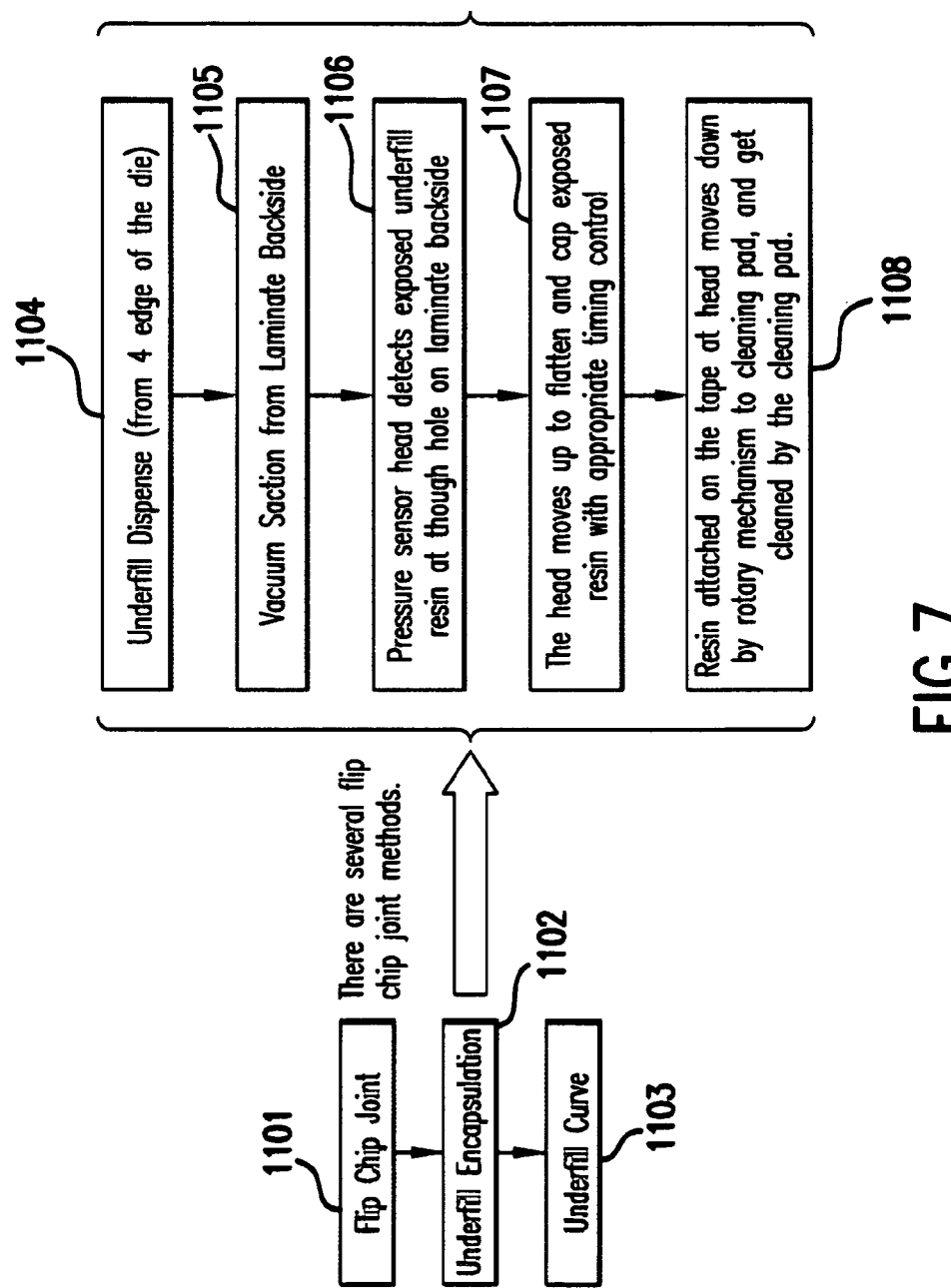
FIG. 7 illustrates a detailed view an underfill process, in accordance with the embodiments of the present invention.

FIG. 7 illustrates a detailed underfill process. Step 1101 is one of the several the flip-chip joint methods. Step 1102 involves the underfill encapsulation process. The underfill encapsulation step 1102 further is comprised of step 1104 involving dispensing underfill resin to all edges of the semiconductor die. Step 1105 comprises providing vacuum suction from the backside of a laminate. Step 1107 comprises a head moving up to flatten and cap exposed resin with the appropriate timing control. Step 1108 comprises a head with a rotary tape mechanism which moves down upon attaching resin. The resin is cleaned by the cleaning pad as the head rotates to move the attached resin past the cleaning pad. Step 1103 comprises an underfill cure process.

Regarding each of the foregoing embodiments, intentionally exposing excessive underfill resin at a rate of approximately at most 10% of the total underfill resin amount at the through hole aids in completely eliminating the occurrence of voids. Further, the tape described in the foregoing embodiments can be re-used.

The apparatus/method of this invention has been described with respect to individual semiconductor flip-chips. However, it is contemplated that the apparatus/method of underfill encapsulation may be employed with a plurality of semiconductor flip-chips.

While particular embodiments of the present invention have been described herein for the purposes of illustration, many modifications and changes will become apparent to those skilled in the art. Accordingly, the appended claims are intended to encompass all such modifications and changes as fall within the true spirit and scope of this invention.

The invention claimed is:

1. A method of underfill encapsulation of a flip-chip assembly comprising:
   providing a semiconductor die having a top surface and a bottom surface wherein said bottom surface is in physical communication with a machine stage; wherein the semiconductor die further comprises a laminate having a through hole,
   dispensing underfill resin in a continuous manner at all peripheral edges of said semiconductor die;
   providing a vacuum suction device, wherein the vacuum suction device provides a suction force on the laminate to enable underfill to spread from all peripheral edges simultaneously such that an excessive underfill resin protrudes from the through hole;
   wherein the machine stage comprises a head mechanism having a pressure sensor and re-usable tape
   which attracts the excessive underfill resin; and
   disposing a cleaning pad at a bottom side of said head mechanism to contact the re-usable tape and clean the excessive underfill resin off of the re-usable tape.

* * * * *